United States Patent
Kim et al.

(10) Patent No.: US 9,455,415 B2
(45) Date of Patent: *Sep. 27, 2016

(54) ORGANIC LIGHT EMITTING DEVICE AND DISPLAY DEVICE

(71) Applicant: LG Display Co., Ltd., Seoul (KR)

(72) Inventors: Shinhan Kim, Seoul (KR); Gwijeong Cho, Daegu (KR); Taeshick Kim, Gyeonggi-do (KR); HyungJune Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/670,446

(22) Filed: Mar. 27, 2015

(65) Prior Publication Data

US 2015/0280159 A1     Oct. 1, 2015

(30) Foreign Application Priority Data

Mar. 27, 2014   (KR) .................. 10-2014-0036224

(51) Int. Cl.
*H01L 51/50*   (2006.01)
*H01L 27/32*   (2006.01)

(52) U.S. Cl.
CPC .............. *H01L 51/504* (2013.01); *H01L 27/32* (2013.01); *H01L 51/5004* (2013.01); *H01L 51/5044* (2013.01); *H01L 51/5056* (2013.01); *H01L 51/5072* (2013.01); *H01L 2251/55* (2013.01)

(58) Field of Classification Search
CPC ............. H01L 27/3209; H01L 51/504; H01L 51/5044; H01L 51/5036; H01L 51/5056; H01L 51/5072; H01L 2251/5376; H01L 27/3213

See application file for complete search history.

(56) References Cited

U.S. PATENT DOCUMENTS

| | | | |
|---|---|---|---|
| 8,471,250 B2 * | 6/2013 | Chen .................. | H01L 51/5036 257/40 |
| 8,564,190 B2 * | 10/2013 | Seo ........................ | C09K 11/06 313/504 |
| 8,735,873 B2 * | 5/2014 | Song ................... | H01L 51/5004 257/40 |
| 8,796,676 B2 * | 8/2014 | Pieh ..................... | H01L 51/5203 257/40 |
| 2006/0040132 A1 | 2/2006 | Liao et al. | |
| 2007/0008257 A1 * | 1/2007 | Seo ..................... | H01L 51/5016 345/83 |
| 2008/0171226 A1 | 7/2008 | Noh et al. | |
| 2009/0001885 A1 | 1/2009 | Spindler et al. | |
| 2011/0073844 A1 * | 3/2011 | Pieh ..................... | H01L 51/5036 257/40 |

(Continued)

FOREIGN PATENT DOCUMENTS

EP            1944809 A2    7/2008
KR    10-2011-0057377 A    6/2011

*Primary Examiner* — Jaehwan Oh

(74) *Attorney, Agent, or Firm* — Morgan, Lewis & Bockius LLP

(57) ABSTRACT

An organic light emitting device may include first and second electrodes; a first emitting part including a first emitting layer, the first emitting part provided between the first and second electrodes, and the first emitting layer having at least two emitting layers including a blue color emitting layer; a second emitting part including a second emitting layer, the second emitting part provided between the first emitting part and the second electrode, and the second emitting layer having at least two emitting layers including an emitting layer for emitting light having wavelength longer than that of the blue color emitting layer; and a third emitting part including a third emitting layer, the third emitting part provided between the second emitting part and the second electrode, and the third emitting layer having at least two emitting layers including a blue color emitting layer.

20 Claims, 8 Drawing Sheets

(56) References Cited

U.S. PATENT DOCUMENTS

| | | | |
|---|---|---|---|
| 2011/0121320 A1* | 5/2011 | Pieh | H01L 51/5036 257/79 |
| 2012/0248971 A1* | 10/2012 | Okuyama | C09K 11/06 313/504 |
| 2014/0291631 A1* | 10/2014 | Lee | H01L 51/508 257/40 |
| 2015/0001506 A1* | 1/2015 | Kim | H01L 51/5278 257/40 |
| 2015/0034923 A1* | 2/2015 | Kim | H01L 51/5044 257/40 |

* cited by examiner

ORGANIC LIGHT EMITTING DEVICE AND DISPLAY DEVICE

CROSS REFERENCE TO RELATED APPLICATIONS

This application claims the benefit of the Korean Patent Application No. 10-2014-0036224 filed on Mar. 27, 2014, which is hereby incorporated by reference as if fully set forth herein.

BACKGROUND

1. Field of the Disclosure

The present invention relates to an organic light emitting device, and more particularly, to an organic light emitting device that emits white light.

2. Discussion of the Related Art

An organic light emitting device is provided in such a structure which a light emitting layer is formed between a cathode for injecting electron and an anode for injecting hole. When the electron generated in the cathode and the hole generated in the anode are injected into the light emitting layer, an exciton is produced by the electron and hole bond. Then, when the exciton falls to a ground state from an excited state, the organic light emitting device emits light.

A white organic light emitting device is an organic light emitting device which emits white light. In the case that the white light is emitted in a deposition structure of two light emitting layers which complement each other, when the white light transmits a color filter, it might be difficult to realize high color reproduction range due to a difference between a peak wavelength for each light emitting layer and a transmission rate in the color filter. For example, if a blue emitting layer and a yellow emitting layer are deposited to emit white light, peak wavelengths are formed in a blue wavelength region and a yellow wavelength region. When this white light transmits each of red, green and blue color filters, a transmittance of red or green wavelength region is relatively lower than a transmittance of blue wavelength region, whereby it causes low color reproduction range and low emitting efficiency. The white organic light emitting device is disclosed in Korean Patent Publication No. 10-2011-0057377, which corresponds with US 2011/0121320.

SUMMARY

Accordingly, the present invention is directed to an organic light emitting device that substantially obviates one or more problems due to limitations and disadvantages of the related art.

An object of the present invention is to provide an organic light emitting device with improved color reproduction range and emitting efficiency.

Additional features and advantages of the invention will be set forth in the description which follows, and in part will be apparent from the description, or may be learned by practice of the invention. The objectives and other advantages of embodiments of the invention may be realized and attained by the structure particularly pointed out in the written description and claims hereof as well as the appended drawings.

To achieve these and other advantages and in accordance with the purpose of the invention, as embodied and broadly described, an organic light emitting device comprises first and second electrodes; a first emitting part including a first emitting layer, the first emitting part provided between the first and second electrodes, and the first emitting layer having at least two emitting layers including a blue color emitting layer; a second emitting part including a second emitting layer, the second emitting part provided between the first emitting part and the second electrode, and the second emitting layer having at least two emitting layers including an emitting layer for emitting light having wavelength longer than that of the blue color emitting layer; and a third emitting part including a third emitting layer, the third emitting part provided between the second emitting part and the second electrode, and the third emitting layer having at least two emitting layers including a blue color emitting layer.

In another aspect, a display device comprises a tandem type white organic light emitting diode (OLED) having at least three emitting parts between two electrodes; a multiple level emitting layer (EML) structure having at least two emitting layers and additional layers, implemented in each of said at least three emitting parts of said tandem type white OLED; and wherein said each of emitting layers is configured on a particular location such that the display device emits white color having a three peak wavelength, based on optimal optical cavity characteristics considering an entire thickness of said tandem type white OLED.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiments of the invention and together with the description serve to explain the principle of embodiments of the invention. In the drawings.

DETAILED DESCRIPTION OF THE INVENTION

Figure 1:
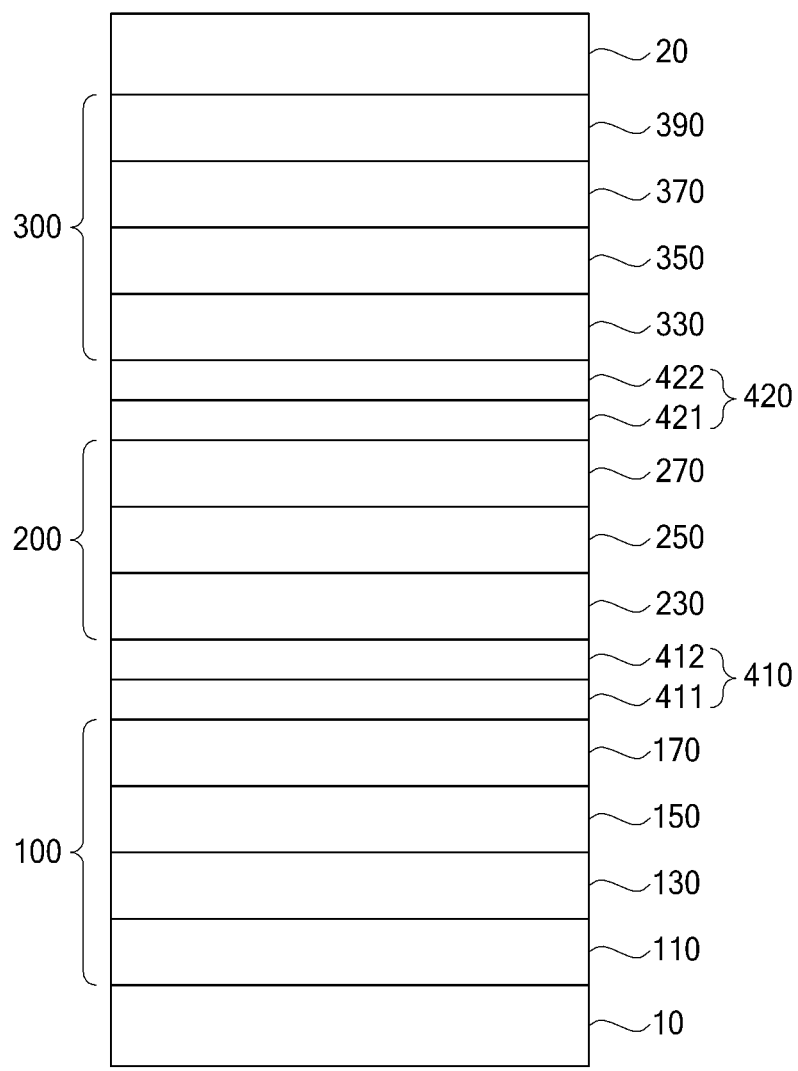
FIG. 1 is a cross sectional view illustrating an organic light emitting device according to an embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, an organic light emitting device according to embodiments of the present invention will be described in detail with reference to the accompanying drawings.

FIG. 1 is a cross sectional view illustrating an organic light emitting device according to an embodiment of the present invention.

As shown in FIG. 1, the organic light emitting device according to an embodiment of the present invention may include a first electrode 10, a second electrode 20, a first emitting part 100, a second emitting part 200, a third emitting part 300, a first charge generating layer 410, and a second charge generating layer 420.

The first electrode 10 may function as an anode. The first electrode 10 may be formed of a transparent material with high conductivity and high work function, for example, Indium Tin Oxide (ITO), Indium Zinc Oxide (IZO), $SnO_2$, ZnO, and etc., but not limited to these materials.

The second electrode 20 may function as a cathode. The second electrode 20 may be formed of a metal material with low work function, for example, aluminum (Al), argentum (Ag), magnesium (Mg), lithium (Li), calcium (Ca), and etc., but not limited to these materials. Also, the second electrode 20 may be formed of a transparent material such as Indium Tin Oxide (ITO) or Indium Zinc Oxide (IZO), or a plurality of layers comprising metals and transparent conductive materials being deposited.

The first emitting part 100 which emits first color light is provided on the first electrode 10. To this end, the first emitting part 100 may include a hole injecting layer (HIL) 110, a first hole transporting layer (HTL) 130, a first emitting layer (EML) 150, and a first electron transporting layer (ETL) 170.

The hole injecting layer (HIL) 110 is provided on the first electrode 10. The hole injecting layer (HIL) 110 may be formed of MTDATA(4,4',4"-tris(3-methylphenylphenylamino)triphenylamine), CuPc(copper phthalocyanine), PEDOT/PSS(poly(3,4-ethylenedioxythiophene, polystyrene sulfonate), and etc., but not limited to these materials.

The first hole transporting layer (HTL) 130 is provided on the hole injecting layer (HIL) 110. The first hole transporting layer (HTL) 130 may be formed of TPD(N,N'-diphenyl-N,N'-bis(3-methylphenyl)-1,1'-bi-phenyl-4,4'-diamine), NPB (N,N'-di(naphthalen-1-yl)-N,N'-diphenyl-benzidine), and etc., but not limited to these materials.

The first emitting layer (EML) 150 is provided on the first hole transporting layer (HTL) 130. The first emitting layer (EML) 150 is formed in such a structure where at least two emitting layers are deposited in sequence. Especially, the first emitting layer (EML) 150 is formed by a combination of a blue emitting layer (B) and another emitting layer whose wavelength is longer than that of the blue emitting layer (B), for example, yellow-green (YG) or red (R) emitting layer deposited in sequence, which will be described later with reference to FIGS. 2A and 2B.

The first electron transporting layer (ETL) 170 is provided on the first emitting layer (EML) 150. The first electron transporting layer (ETL) 170 may be formed of oxadiazole, triazole, phenanthroline, benzoxazole, benzthiazole, and etc., but not limited to these materials.

The second emitting part 200 which emits second color light is provided on the first emitting part 100, particularly, directly on an upper surface of the first charge generating layer 410. The second color light emitted from the second emitting part 200 is different from the first color light emitted from the first emitting part 100. To this end, the second emitting part 200 may include a second hole transporting layer (HTL) 230, a second emitting layer (EML) 250, and a second electron transporting layer (ETL) 270.

The second hole transporting layer (HTL) 230 is provided on the first emitting part 100, particularly, directly on an upper surface of the first charge generating layer 410. The second hole transporting layer (HTL) 230 may be formed of the same material as that of the first hole transporting layer (HTL) 130, but not necessarily to limited to the same material.

The second emitting layer (EML) 250 is provided on the second hole transporting layer (HTL) 230. The second emitting layer (EML) 250 is formed in such a structure where at least two emitting layers for emitting light whose wavelength is longer than that of blue (B) light are deposited in sequence. Especially, the second emitting layer (EML) 250 is formed in a deposition structure of at least two emitting layers among a green (G) emitting layer, a yellow-green (YG) emitting layer and a red (R) emitting layer, which will be described later with reference to FIGS. 3A to 3D.

The second electron transporting layer (ETL) 270 is provided on the second emitting layer (EML) 250. The second electron transporting layer (ETL) 270 may be formed of the same material as that of the first electron transporting layer (ETL) 170, but not necessarily to limited to the same material.

The third emitting part 300 which emits third color light is provided on the second emitting part 200, particularly, directly on an upper surface of the second charge generating layer 420. The third color light emitted from the third emitting part 300 is different from the second color light emitted from the second emitting part 200. To this end, the third emitting part 300 may include a third hole transporting layer (HTL) 330, a third emitting layer (EML) 350, a third electron transporting layer (ETL) 370, and an electron injecting layer (EIL) 390.

The third hole transporting layer (HTL) 330 is provided on the second emitting part 200, particularly, directly on an upper surface of the second charge generating layer 420. The third hole transporting layer (HTL) 330 may be formed of the same material as that of the first hole transporting layer (HTL) 130 or second hole transporting layer (HTL) 230, but not necessarily limited to the same material.

The third emitting layer (EML) 350 is provided on the third hole transporting layer (HTL) 330. The third emitting layer (EML) 350 is formed in such a structure where at least two emitting layers for emitting lights whose wavelengths are different from each other are deposited in sequence. Especially, the third emitting layer (EML) 350 is formed by a combination of a blue emitting layer (B) and another emitting layer whose wavelength is longer than the blue emitting layer (B), for example, yellow-green (YG) or red (R) emitting layer deposited in sequence, which will be described later with reference to FIGS. 4A and 4B.

The third electron transporting layer (ETL) 370 is provided on the third emitting layer (EML) 350. The third electron transporting layer (ETL) 370 may be formed of the same material as that of the first electron transporting layer (ETL) 170 or second electron transporting layer (ETL) 270, but not necessarily limited to the same material.

The electron injecting layer (EIL) 390 may be formed of lithium fluoride (LiF) or lithium quinolate (LiQ), but not necessarily limited to these materials.

The first charge generating layer (CGL) 410 is provided between the first emitting part 100 and the second emitting part 200, wherein the first charge generating layer (CGL) 410 adjusts a balance of charge between the first and second emitting parts 100 and 200. Especially, the first charge generating layer (CGL) 410 may include an N-type first charge generating layer (N-CGL) 411 being adjacent to the first emitting part 100, and a P-type first charge generating layer (P-CGL) 412 being adjacent to the second emitting part 200. The N-type first charge generating layer (N-CGL) 411 injects the electron into the first emitting part 100, and the P-type first charge generating layer (P-CGL) 412 injects the hole into the second emitting part 200.

The second charge generating layer (CGL) 420 is provided between the second emitting part 200 and the third emitting part 300, wherein the second charge generating layer (CGL) 420 adjusts a balance of charge between the second and third emitting parts 200 and 300. Especially, the second charge generating layer (CGL) 420 may include an N-type second charge generating layer (N-CGL) 421 being adjacent to the second emitting part 200, and a P-type second charge generating layer (P-CGL) 422 being adjacent to the third emitting part 300. The N-type second charge generating layer (N-CGL) 421 injects the electron into the second emitting part 200, and the P-type second charge generating layer (P-CGL) 422 injects the hole into the third emitting part 300.

The N-type first charge generating layer (N-CGL) 411 and the N-type second charge generating layer (N-CGL) 421 may be formed of an organic layer doped with alkali metals such as Li, Na, K or Cs, or doped with alkali earth metals such as Mg, Sr, Ba or Ra, but not necessarily limited to these materials.

The P-type first charge generating layer (P-CGL) 412 and the P-type second charge generating layer (P-CGL) 422 may be formed of an organic layer including P-type dopant, but not necessarily limited to these materials.

As described above, the organic light emitting device according to an embodiment of the present invention includes the first emitting part 100 for emitting the first color light, the second emitting part 200 for emitting the second color light, and the third emitting part 300 for emitting the third color light, which shows the following effects.

First, according to an embodiment of the present invention, the first emitting layer (EML) 150 included in the first emitting part 100 comprises the emitting layer for emitting the blue (B) light, and the third emitting layer (EML) 350 included in the third emitting part 300 also comprises the emitting layer for emitting the blue (B) light, whereby the blue (B) light with relatively-low efficiency is emitted from the two emitting parts, to thereby enhance a total emitting efficiency Also, according to an embodiment of the present invention, each of the first emitting layer (EML) 150 included in the first emitting part 100, the second emitting layer (EML) 250 included in the second emitting part 200, and the third emitting layer (EML) 350 included in the third emitting part 300 is formed of at least two emitting layers for emitting the lights with the different wavelengths so that it is possible to realize high color reproduction range and high color purity. This will be described in detail as follows. When white light passes through a color filter, only light with a particular wavelength, for example, red, green or blue light is transmitted through the color filter, to thereby realize a color. Supposing that white light is made by mixing lights with different wavelengths. In this case, if the white light made by mixing lights with many different wavelengths passes through the color filter, it enables to raise a possibility of realizing a desired color, to thereby realize high color reproduction range and high color purity. For example, if color reproduction range and color purity of white light made by mixing red, green and blue colors passing through a green color filter is relatively higher than color reproduction range and color purity of white light made by mixing blue and yellow colors passing through a green color filter.

That is, according to an embodiment of the present invention, each of the first emitting part 100, the second emitting part 200 and the third emitting part 300 includes at least two emitting layers, whereby the organic light emitting device according to an embodiment of the present invention totally includes at least six emitting layers. Thus, the organic light emitting device according to an embodiment of the present invention is advantageous in that it enables to realize high color reproduction range and high color purity. However, it is difficult to realize high color reproduction range and high color purity if an arrangement of the emitting layers is not optimized in the structure of each emitting part including at least two emitting layers.

Hereinafter, a structure of emitting parts including the first to third emitting parts 100 to 300 according to an embodiment of the present invention, which is optimized to realize high color reproduction range and high color purity, will be described as follows.

Figure 2A:
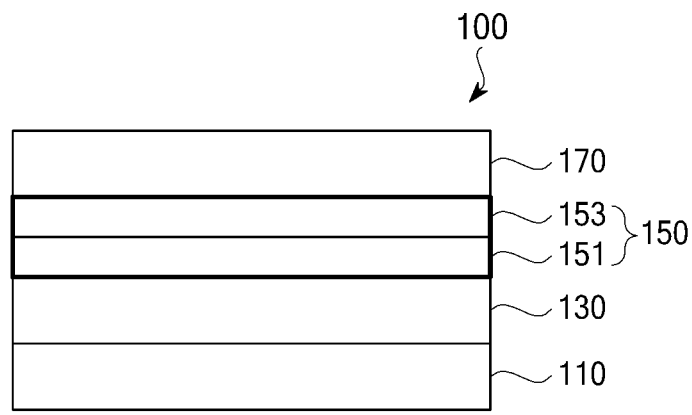
FIGS. 2A and 2B are cross sectional views illustrating a first emitting part of the organic light emitting device according to embodiments of the present invention.
Figure 2B:
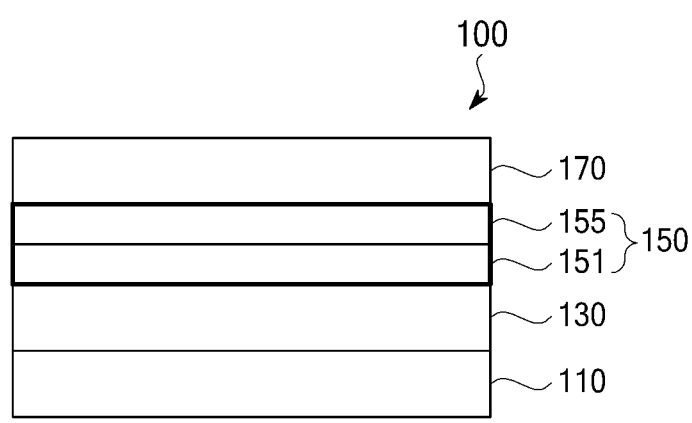

FIGS. 2A and 2B are cross sectional views illustrating the first emitting part 100 of the organic light emitting device according to the embodiments of the present invention.

As shown in FIGS. 2A and 2B, the first emitting part 100 according to the embodiments of the present invention may include the hole injecting layer (HIL) 110, the first hole transporting layer (HTL) 130, the first emitting layer (EML) 150, and the first electron transporting layer (ETL) 170.

The hole injecting layer (HIL) 110, the first hole transporting layer (HTL) 130 and the first electron transporting layer (ETL) 170 are the same as those described above, which are shown in relatively light colored lines.

The first emitting layer (EML) 150 is formed of the two emitting layers which emit the lights with the different wavelengths from each other, as shown in FIGS. 2A and 2B, which is shown in relatively dark colored lines, for convenience of explanation. In the following FIGS. 3A to 3D and FIGS. 4A and 4B, for convenience of explanation, the varying emitting layer is shown in the relatively dark colored lines, and the other elements are shown in the relatively light colored lines.

As shown in FIG. 2A, the first emitting layer (EML) 150 may be formed of a first emitting layer of blue (B) color (which is referred to as 'blue-color first emitting layer B-EML') 151, and a first emitting layer of red (R) color (which is referred to as 'red-color first emitting layer R-EML') 153. The blue-color first emitting layer (B-EML) 151 is provided on the first hole transporting layer (HTL) 130, and the red-color first emitting layer (R-EML) 153 is provided on the blue-color first emitting layer (B-EML) 151.

As shown in FIG. 2B, the first emitting layer (EML) 150 may be formed of a blue-color first emitting layer (B-EML) 151, and a first emitting layer of yellow-green (YG) color (which is referred to as 'yellow-green color first emitting layer YG-EML') 155. The blue-color first emitting layer (B-EML) 151 is provided on the first hole transporting layer (HTL) 130, and the yellow-green color first emitting layer (YG-EML) 155 is provided on the blue-color first emitting layer (B-EML) 151.

According to an embodiment of the present invention, the first emitting layer (EML) 150 may include the blue-color first emitting layer (B-EML) 151 and the red-color first emitting layer (R-EML) 153, as shown in FIG. 2A, or may include the blue-color first emitting layer (B-EML) 151 and the yellow-green color first emitting layer (YG-EML) 155, as shown in FIG. 2B, whereby it is possible to improve color reproduction range and color purity of the organic light emitting device.

In the above FIGS. 2A and 2B, the blue-color first emitting layer (B-EML) 151 is formed on an upper surface of the first hole transporting layer (HTL) 130, and the red-color first emitting layer (R-EML) 153 or yellow-green color first emitting layer (YG-EML) 155 is formed on an upper surface of the blue-color first emitting layer (B-EML) 151, but not necessarily limited to this structure. Even though the red-color first emitting layer (R-EML) 153 or yellow-green color first emitting layer (YG-EML) 155 is formed on an upper surface of the first hole transporting layer (HTL) 130, and the blue-color first emitting layer (B-EML) 151 is formed on an upper surface of the red-color first emitting layer (R-EML) 153 or yellow-green color first emitting layer (YG-EML) 155, it is possible to improve color reproduction range and color purity of the organic light emitting device.

However, as shown in FIGS. 2A and 2B, when the blue-color first emitting layer (B-EML) 151 is formed on the upper surface of the first hole transporting layer (HTL) 130, and the red-color first emitting layer (R-EML) 153 or yellow-green color first emitting layer (YG-EML) 155 is formed on the upper surface of the blue-color first emitting layer (B-EML) 151, the following effects may be additionally obtained together with the high color reproduction range and color purity.

According to an embodiment of the present invention, since the first emitting part 100 which is positioned most adjacent to the first electrode 110 functioning as the anode includes the blue-color first emitting layer (B-EML) 151, it is possible to improve emitting efficiency of blue (B) emitting material comprising a fluorescent material whose emitting efficiency is lower than that of a phosphorescent material.

According to an embodiment of the present invention, the blue-color first emitting layer (B-EML) 151 is positioned closer to the first electrode 110, and the red-color first emitting layer (R-EML) 153 or yellow-green color first emitting layer (YG-EML) 155 is positioned relatively distant from the first electrode 110, whereby it is possible to improve the micro-cavity properties without increasing a device thickness, and furthermore to improve a luminance of the organic light emitting device. According to the micro-cavity properties, a constructive interference is created through a repetitive reflection and re-reflection of the light emitted from the emitting layer, to thereby enhance an outcoupling efficiency.

According to an embodiment of the present invention, instead of forming a green-color emitting layer on the blue-color first emitting layer (B-EML) 151, the red-color first emitting layer (R-EML) 153 is formed on the blue-color first emitting layer (B-EML) 151, as shown in FIG. 2A, or the yellow-green color first emitting layer (YG-EML) 155 is formed on the blue-color first emitting layer (B-EML) 151, as shown in FIG. 2B, whereby it is possible to prevent emitting efficiency of the blue-color first emitting layer (B-EML) 151 from being lowered. This will be described in detail. In consideration of micro-cavity effect created between the two electrodes, if two emitting layers whose wavelength ranges are very similar to each other are formed adjacent to each other, micro-cavity distances of the two emitting layers are very similar to each other, whereby an energy transfer easily occurs between the two emitting layers, and thus it causes a problem of reducing an emitting efficiency of at least one of the two emitting layers. That is, when the blue (B)-color emitting layer and the green (G)-color emitting layer are brought into contact with each other, a micro-cavity distance of blue (B) wavelength range is very similar to a micro-cavity distance of green (G) wavelength range, whereby an emitting efficiency of at least one of blue (B) and green (G) colors may be lowered.

Accordingly, in case of an embodiment of the present invention, the red-color first emitting layer (R-EML) 153 or yellow-green color first emitting layer (YG-EML) 155 is formed on the blue-color first emitting layer (B-EML) 151.

In order to improve the color purity, it is needed to optimize the emitting properties of emitting dopant comprising the blue-color first emitting layer (B-EML) 151, the red-color first emitting layer (R-EML) 153 and the yellow-green color first emitting layer (YG-EML) 155.

According to an embodiment of the present invention, blue (B) dopant comprising the blue-color first emitting layer (B-EML) 151 has a peak wavelength (λmax) which is smaller than 456 nm, and has a full width at half maximum (FWHM) between 30 nm and 40 nm, preferably.

The blue dopant (B) having the above-mentioned peak wavelength (λmax) range and the above-mentioned full width at half maximum (FWHM) range may be formed of a pyrene-based compound of a blue (B) fluorescent material, and more particularly, a pyrene-based compound substituted by an arylamine-based compound, but not necessarily limited to this compound. For example, the pyrene-based compound may be formed of a compound expressed by the following Chemical Formula 1, but not necessarily limited to this compound.

[Chemical Formula 1]

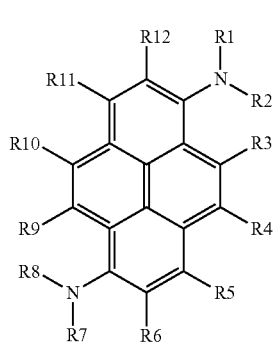

In the above Chemical Formula 1, each of 'R1' to 'R12' may be selected from groups of hydrogen, deuterium, cyanine group, halogen group, substituted or un-substituted alkyl group of C1~C20, substituted or un-substituted alkoxyl group of C1~C20, substituted or un-substituted silyl group of C1~C20, substituted or un-substituted aryl group of C6~C30, substituted or un-substituted hetero aryl group of C6~C30, substituted or un-substituted cycloalkyl group of C3~C30, substituted or un-substituted aryloxy group of C6~C20, substituted or un-substituted aryl amino group of C12~C40, and substituted or un-substituted alkylamino group of C1~C20.

Also, red dopant (R) comprising the red-color first emitting layer (R-EML) 153 has a peak wavelength (λmax) between 620 nm and 630 nm, and has a full width at half maximum (FWHM) between 50 nm and 60 nm, preferably.

Also, yellow-green dopant (YG) comprising the yellow-green color first emitting layer (YG-EML) 155 has a peak wavelength (λmax) between 540 nm and 550 nm, and has a full width at half maximum (FWHM) between 70 nm and 100 nm, preferably.

The red dopant (R) and yellow-green dopant (YG) having the above-mentioned peak wavelength (λmax) range and the above-mentioned full width at half maximum (FWHM) range may be formed of an iridium-based compound, but not limited to this compound. For example, the iridium-based compound may include N—N, N—O, N—C and O—O bond. In more detail, the iridium-based compound may include the following compounds expressed by the Chemical Formulas 2 to 7, but not milted to these compounds.

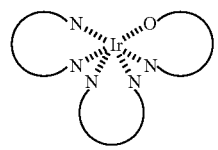
[Chemical Formula 2]

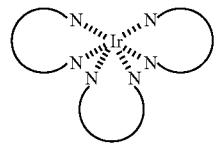
[Chemical Formula 3]

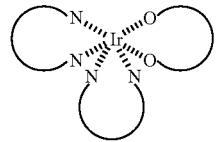
[Chemical Formula 4]

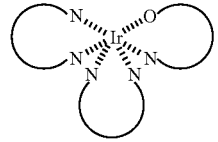
[Chemical Formula 5]

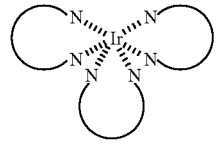
[Chemical Formula 6]

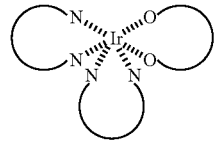
[Chemical Formula 7]

When the peak wavelength (λmax) range and the full width at half maximum (FWHM) range for each of the blue (B), red (R) and yellow-green (YG) dopants are within the above-mentioned range, it is possible to minimize an unnecessary emitting range, and to minimize an influence on a neighboring wavelength range.

FIGS. 3A to 3D are cross sectional views illustrating the second emitting part 200 of the organic light emitting device according to the embodiments of the present invention.

As shown in FIGS. 3A to 3D, the second emitting part 200 according to the embodiments of the present invention may include the second hole transporting layer (HTL) 230, the second emitting layer (EML) 250, and the second electron transporting layer (ETL) 270.

The second hole transporting layer (HTL) 230 and the second electron transporting layer (ETL) 270 are the same as those described above. The second emitting layer (EML) 250 may be formed of two or three emitting layers which emit the lights with the different wavelengths.

Figure 3A:
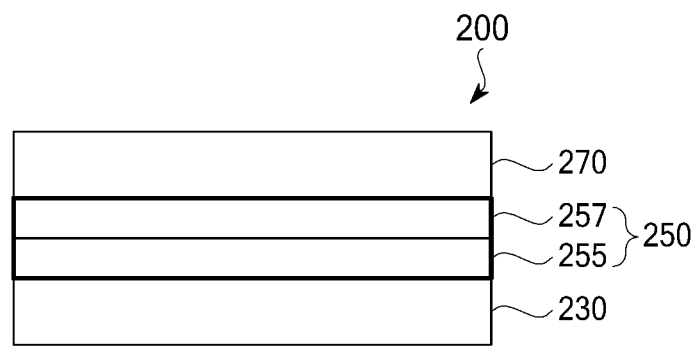
FIGS. 3A to 3D are cross sectional views illustrating a second emitting part of the organic light emitting device according to embodiments of the present invention.

As shown in FIG. 3A, the second emitting layer (EML) 250 may be formed of a second emitting layer of yellow-green (YG) color (which is referred to as 'yellow-green color second emitting layer YG-EML') 255, and a second emitting layer of green (G) color (which is referred to as 'green-color second emitting layer G-EML') 257.

The yellow-green color second emitting layer (YG-EML) 255 is provided on the second hole transporting layer (HTL)

230, and the green-color second emitting layer (G-EML) 257 is provided on the yellow-green color second emitting layer (YG-EML) 255.

Figure 3B:
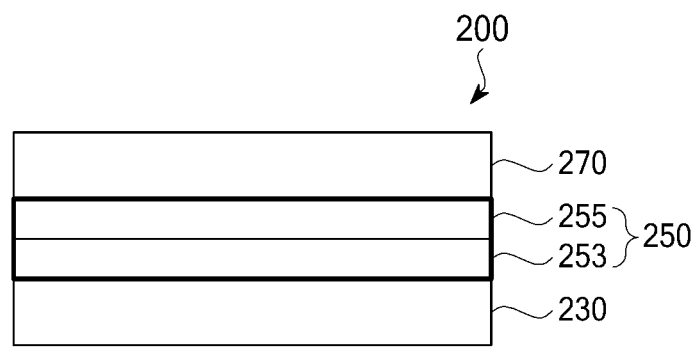

As shown in FIG. 3B, the second emitting layer (EML) 250 may be formed of a second emitting layer of red (R) color (which is referred to as 'red-color second emitting layer R-EML) 253, and a yellow-green color second emitting layer (YG-EML) 255.

The red-color second emitting layer (R-EML) 253 is provided on the second hole transporting layer (HTL) 230, and the yellow-green color second emitting layer (YG-EML) 255 is provided on the red-color second emitting layer (R-EML) 253.

Figure 3C:
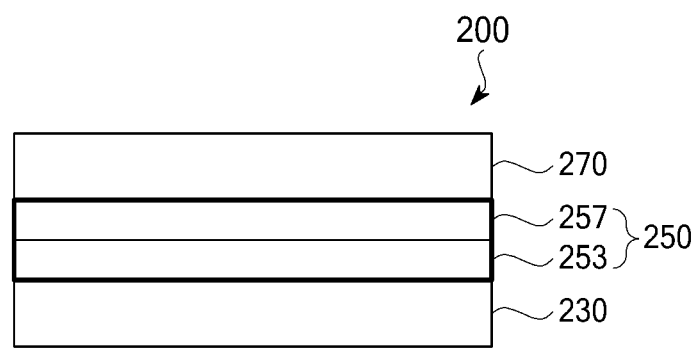

As shown in FIG. 3C, the second emitting layer (EML) 250 may be formed of a red-color second emitting layer (R-EML) 253, and a green-color second emitting layer (G-EML) 257.

The red-color second emitting layer (R-EML) 253 is provided on the second hole transporting layer (HTL) 230, and the green-color second emitting layer (G-EML) 257 is provided on the red-color second emitting layer (R-EML) 253.

Figure 3D:
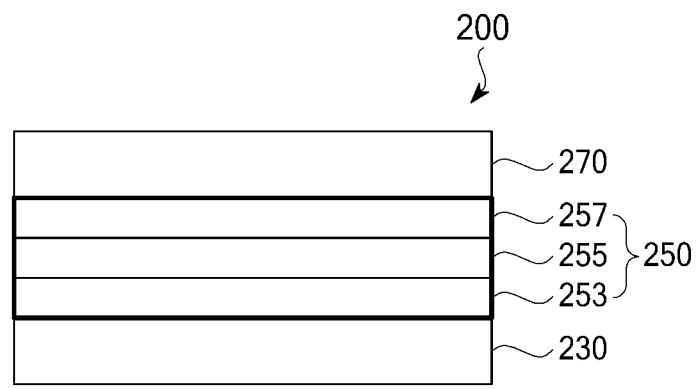

As shown in FIG. 3D, the second emitting layer (EML) 250 may be formed of a red-color second emitting layer (R-EML) 253, a yellow-green color second emitting layer (YG-EML) 255, and a green-color second emitting layer (G-EML) 257.

The red-color second emitting layer (R-EML) 253 is provided on the hole transporting layer (HTL) 230, the yellow-green color second emitting layer (YG-EML) 255 is provided on the red-color second emitting layer (R-EML) 253, and the green-color second emitting layer (G-EML) 257 is provided on the yellow-green color second emitting layer (YG-EML) 255.

According to an embodiment of the present invention, the second emitting part 200 interposed between the two emitting parts 100 and 300 comprises the two or three emitting layers, and each emitting layer included in the second emitting part 200 emits the light whose wavelength is longer than that of the blue (B) light, whereby it is possible to improve color reproduction range and color purity of the organic light emitting device for emitting white light.

Among the two or three emitting layers shown in FIGS. 3A to 3D, the emitting layer for emitting the light with the relatively-long wavelength is positioned closer to the second hole transporting layer (HTL) 230 or first electrode (See element 110 of FIG. 1) than the emitting layer for emitting the light with the relatively-short wavelength, but not necessarily. Even though the emitting layer for emitting the light with the relatively-long wavelength is positioned relatively distant from the second hole transporting layer (HTL) 230 or first electrode (See element 110 of FIG. 1) in comparison with the emitting layer for emitting the light with the relatively-short wavelength, it is possible to improve color reproduction range and color purity of the organic light emitting device for emitting white light.

However, when the emitting layer for emitting the light with the relatively-long wavelength is positioned closer to the second hole transporting layer (HTL) 230 or first electrode (See element 110 of FIG. 1) than the emitting layer for emitting the light with the relatively-short wavelength, as shown in FIGS. 3A to 3D, the micro-cavity properties may be enhanced more, and the luminance of organic light emitting device may be improved.

In order to improve the color purity, it is needed to optimize the emitting properties of emitting dopant comprising the red-color second emitting layer (R-EML) 253, the yellow-green color second emitting layer (YG-EML) 255, and the green-color second emitting layer (G-EML) 257.

In the same manner as the aforementioned red dopant (R) comprising the red-color first emitting layer (R-EML) 153, red dopant (R) comprising the red-color second emitting layer (R-EML) 253 has a peak wavelength ($\lambda$max) between 620 nm and 630 nm, and has a full width at half maximum (FWHM) between 50 nm and 60 nm, preferably.

Also, in the same manner as the aforementioned yellow-green dopant (YG) comprising the yellow-green color first emitting layer (YG-EML) 155, yellow-green dopant (YG) comprising the yellow-green color second emitting layer (YG-EML) 255 has a peak wavelength ($\lambda$max) between 540 nm and 550 nm, and has a full width at half maximum (FWHM) between 70 nm and 100 nm, preferably.

Also, green dopant (G) comprising the green-color second emitting layer (G-EML) 257 has a peak wavelength ($\lambda$max) between 515 nm and 535 nm, and has a full width at half maximum (FWHM) between 70 nm and 80 nm, preferably.

The red dopant (R), yellow-green dopant (YG) and green dopant (G) having the above-mentioned peak wavelength ($\lambda$max) range and the above-mentioned full width at half maximum (FWHM) range may be formed of an iridium-based compound, but not limited to this compound. For example, the iridium-based compound may include N—N, N—O, N—C and O—O bond. In more detail, the iridium-based compound may include the compounds expressed by the above Chemical Formulas 2 to 7, but not milted to these compounds.

Figure 4A:
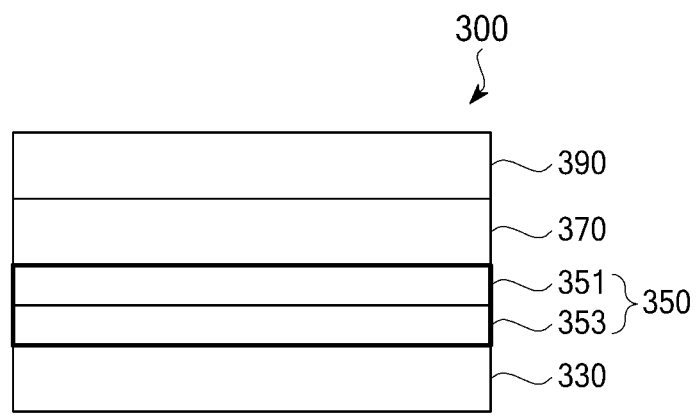
FIGS. 4A and 4B are cross sectional views illustrating a third emitting part of the organic light emitting device according to embodiments of the present invention.
Figure 4B:
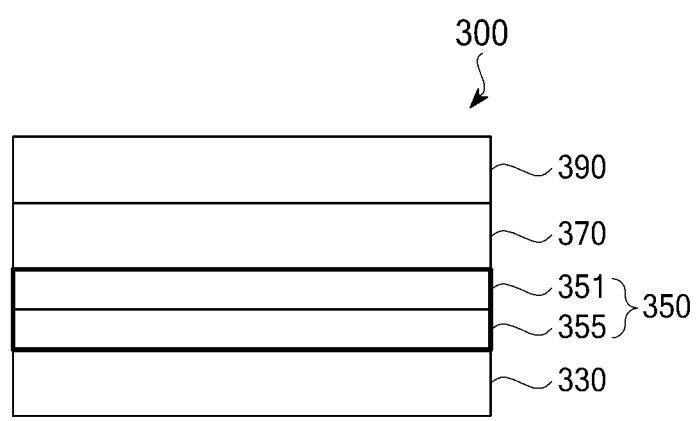

FIGS. 4A and 4B are cross sectional views illustrating the third emitting part 300 of the organic light emitting device according to the embodiments of the present invention.

As shown in FIGS. 4A and 4B, the third emitting part 300 according to the embodiments of the present invention may include the third hole transporting layer (HTL) 330, the third emitting layer (EML) 350, the third electron transporting layer (ETL) 370, and the electron injecting layer (EIL) 390.

The third hole transporting layer (HTL) 330, the third electron transporting layer (ETL) 370, and the electron injecting layer (EIL) 390 are the same as those described above. The third emitting layer (EML) 350 may be formed of two emitting layers which emit the lights with the different wavelengths.

As shown in FIG. 4A, the third emitting layer (EML) 350 may be formed of a third emitting layer of red (R) color (which is referred to as 'red-color third emitting layer R-EML') 353, and a third emitting layer of blue (B) color (which is referred to as 'blue-color third emitting layer B-EML') 351.

The red-color third emitting layer (R-EML) 353 is provided on the third hole transporting layer (HTL) 330, and the blue-color third emitting layer (B-EML) 351 is provided on the red-color third emitting layer (R-EML) 353.

As shown in FIG. 4B, the third emitting layer (EML) 350 may be formed of a third emitting layer of yellow-green (YG) color (which is referred to as 'yellow-green color third emitting layer YG-EML') 355, and a blue-color third emitting layer (B-EML) 351.

The yellow-green color third emitting layer (YG-EML) 355 is provided on the third hole transporting layer (HTL) 330, and the blue-color third emitting layer (B-EML) 351 is provided on the yellow-green color third emitting layer (YG-EML) 355.

According to an embodiment of the present invention, the third emitting layer (EML) 350 may include the blue-color third emitting layer (B-EML) 351 and the red-color third emitting layer (R-EML) 353 as shown in FIG. 4A, or may include the blue-color third emitting layer (B-EML) 351 and the yellow-green color third emitting layer (YG-EML) 355 as shown in FIG. 4B, to thereby improve color reproduction range and color purity of the organic light emitting device.

In FIGS. 4A and 4B, the red-color third emitting layer (R-EML) 353 or yellow-green color third emitting layer (YG-EML) 355 is formed on an upper surface of the third hole transporting layer (HTL) 330, and the blue-color third emitting layer (B-EML) 351 is formed on an upper surface of the red-color third emitting layer (R-EML) 353 or yellow-green color third emitting layer (YG-EML) 355, but not limited to this structure. Even though the blue-color third emitting layer (B-EML) 351 is formed on an upper surface of the third hole transporting layer (HTL) 330, and the red-color third emitting layer (R-EML) 353 or yellow-green color third emitting layer (YG-EML) 355 is formed on an upper surface of the blue-color third emitting layer (B-EML) 351, it is possible to improve color reproduction range and color purity of the organic light emitting device.

However, as shown in FIGS. 4A and 4B, when the red-color third emitting layer (R-EML) 353 or yellow-green color third emitting layer (YG-EML) 355 is formed on an upper surface of the third hole transporting layer (HTL) 330, and the blue-color third emitting layer (B-EML) 351 is formed on an upper surface of the red-color third emitting layer (R-EML) 353 or yellow-green color third emitting layer (YG-EML) 355, the following effects may be additionally obtained together with the high color reproduction range and color purity.

According to an embodiment of the present invention, the third emitting part 300 which is positioned most adjacent to the second electrode (See element 20 of FIG. 3) includes the blue-color third emitting layer (B-EML) 351, it is possible to improve emitting efficiency of blue (B) emitting material comprising a fluorescent material whose emitting efficiency is lower than that of a phosphorescent material.

According to an embodiment of the present invention, since the blue-color third emitting layer (B-EML) 351 is positioned closer to the second electrode 20, it is possible to improve the micro-cavity properties without increasing a device thickness, and furthermore to improve a luminance of the organic light emitting device.

According to an embodiment of the present invention, the third emitting layer 350 is formed in a combination structure of the blue-color third emitting layer (B-EML) 351 and the red-color third emitting layer (R-EML) 353 or in a combination structure of the blue-color third emitting layer (B-EML) 351 and the yellow-green color third emitting layer (YG-EML) 355, whereby it is possible to prevent the lowering of emitting efficiency, in the same manner as the aforementioned first emitting part 100.

In order to improve the color purity, it is needed to optimize the emitting properties of emitting dopant comprising the blue-color third emitting layer (B-EML) 351, the red-color third emitting layer (R-EML) 353, and the yellow-green color third emitting layer (YG-EML) 355. Preferably, emitting dopant for each color emitting layer has the peak wavelength ($\lambda$max) range and the full width at half maximum (FWHM) range, which are the same as those of the aforementioned first and second emitting parts 100 and 200.

When the white light is made by mixing the lights with the various wavelengths, it is possible to improve the color reproduction range and color purity. In this respect, if the yellow-green (YG) color emitting layer is included in the first emitting part 100 and the third emitting part 300, the red (R) color emitting layer is included in the second emitting part 200, preferably. If the red (R) color emitting layer is included in the first emitting part 100 and the third emitting part 300, the green (G) color emitting layer and the yellow-green (YG) color emitting layer are included in the second emitting part 200, preferably.

Figure 5:
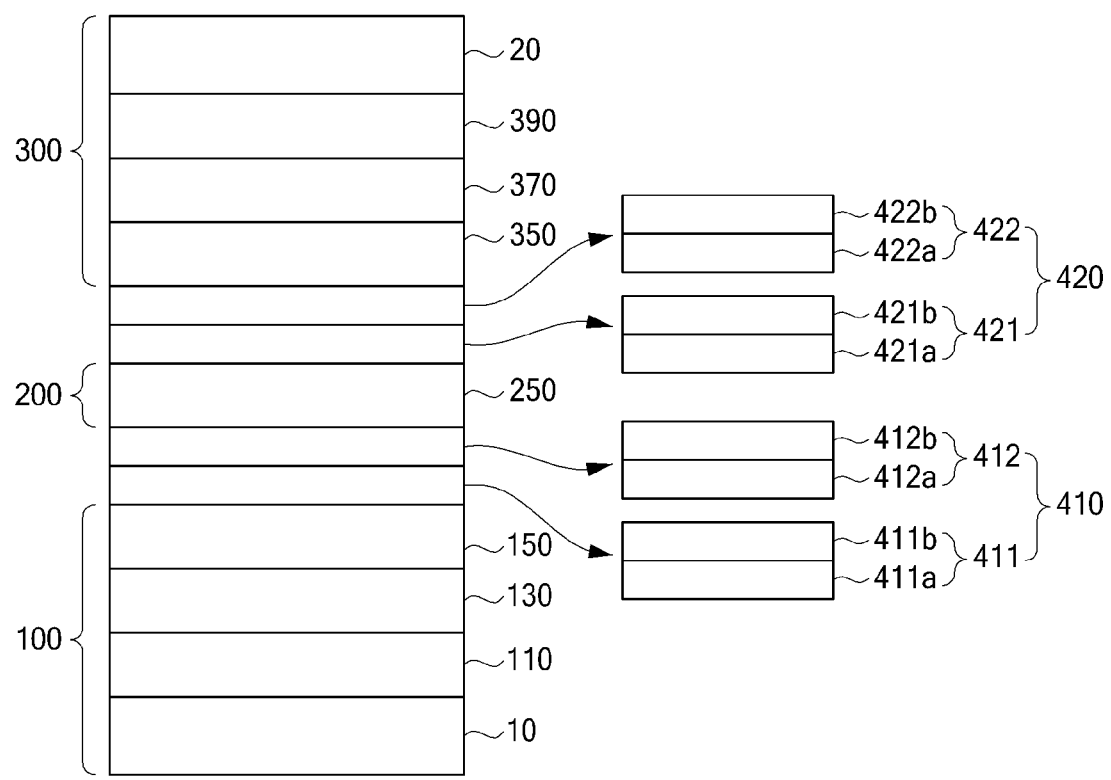
FIG. 5 is a cross sectional view illustrating an organic light emitting device according to another embodiment of the present invention.

FIG. 5 is a cross sectional view illustrating an organic light emitting device according to another embodiment of the present invention. The organic light emitting device shown in FIG. 5 is formed by changing a structure of first and second charge generating layers 410 and 420 of the organic light emitting device shown in FIG. 1, whereby the number of organic layers deposited in each of first, second and third emitting parts 100, 200 and 300 is reduced in the organic light emitting device shown in FIG. 5.

As shown in FIG. 5, the organic light emitting device according to another embodiment of the present invention may include a first electrode 10, a second electrode 20, a first emitting part 100, a second emitting part 200, a third emitting part 300, a first charge generating layer 410, and a second charge generating layer 420.

In the same manner as the above embodiment of the present invention, the first electrode 10 may function as an anode, and the second electrode 20 may function as a cathode. Also, the first and second electrodes 10 and 20 may be formed of the same materials as those of the above embodiment of the present invention.

The first emitting part 100 which emits first color light is provided on the first electrode 10. The first emitting part 100 may include a hole injecting layer (HIL) 110, a first hole transporting layer (HTL) 130, and a first emitting layer (EML) 150. Except for a removal of the first electron transporting layer (ETL) 170, the first emitting part 100 of FIG. 5 is the same as the first emitting part 100 of FIG. 1. Thus, the first emitting layer (EML) 150 may be variously changed as shown in the above FIGS. 2A and 2B.

According to another embodiment of the present invention, the first electron transporting layer (ETL) 170 is removed from the first emitting part 100, whereby a deposition process of the first emitting part 100 shown in FIG. 5 is relatively simplified in comparison to a deposition process of the first emitting part 100 shown in FIG. 1. Meanwhile, a function of the first electron transporting layer 170 is performed by the first charge generating layer 410, which will be described later.

The second emitting part 200 which emits second color light is provided on the first emitting part 100, particularly, directly on an upper surface of the first charge generating layer 410. The second emitting part 200 comprises a second emitting layer (EML) 250. Except for a removal of the second hole transporting layer (HTL) 230 and second electron transporting layer (ETL) 270, the second emitting part 200 of FIG. 5 is the same as the second emitting part 200 of FIG. 1. Thus, the second emitting layer (EML) 250 may be variously changed as shown in the above FIGS. 3A to 3D.

According to another embodiment of the present invention, the second hole transporting layer (HTL) 230 and second electron transporting layer (ETL) 270 are removed from the second emitting part 200, whereby a deposition process of the second emitting part 200 shown in FIG. 5 is relatively simplified in comparison to a deposition process of the second emitting part 200 shown in FIG. 1. Meanwhile, a function of the second hole transporting layer (HTL) 230 and second electron transporting layer (ETL) 270 is performed by the first charge generating layer 410 and second charge generating layer 420, which will be described later.

The third emitting part 300 which emits third color light is provided on the second emitting part 200, particularly, directly on an upper surface of the second charge generating layer 420. The third emitting part 300 comprises a third emitting layer (EML) 350, a third electron transporting layer (ETL) 370, and an electron injecting layer (EIL) 390. Except for a removal of the third hole transporting layer (HTL) 330, the third emitting part 300 of FIG. 5 is the same as the third emitting part 300 of FIG. 1. Thus, the third emitting layer (EML) 350 may be variously changed as shown in the above FIGS. 4A and 4B.

According to another embodiment of the present invention, the third hole transporting layer (HTL) 330 is removed from the third emitting part 300, whereby a deposition process of the third emitting part 300 shown in FIG. 5 is relatively simplified in comparison to a deposition process of the third emitting part 300 shown in FIG. 1. Meanwhile, a function of the third hole transporting layer (HTL) 330 is performed by the second charge generating layer 420, which will be described later.

The first charge generating layer (CGL) 410 is provided between the first emitting part 100 and the second emitting part 200. The first charge generating layer (CGL) 410 comprises an N-type first charge generating layer (N-CGL) 411 being adjacent to the first emitting part 100, and a P-type first charge generating layer (P-CGL) 412 being adjacent to the second emitting part 200.

The N-type first charge generating layer (N-CGL) 411 may comprise an N-type first non-doped layer 411a of a host material, and an N-type first doped layer 411b formed by a combination of the host material and a dopant material.

The N-type first non-doped layer 411a is provided on the first emitting layer (EML) 150 of the first emitting part 100, particularly, directly on an upper surface of the first emitting layer (EML) 150. That is, the N-type first non-doped layer 411a is in contact with the first emitting layer (EML) 150. The N-type first doped layer 411b is provided on the N-type first non-doped layer 411a, particularly, directly on an upper surface of the N-type first non-doped layer 411a.

The N-type first non-doped layer 411a is formed of a host material which has an electron transporting capacity, whereby the electron is transported to the first emitting layer (EML) 150 of the first emitting part 100 by the N-type first non-doped layer 411a. In this respect, it is possible to remove the first electron transporting layer (ETL) 170 from the first emitting part 100. According as the first electron transporting layer (ETL) 170 is removed from the first emitting part 100, the N-type first non-doped layer 411a is provided directly on the upper surface of the first emitting layer (EML) 150.

The N-type first doped layer 411b is formed by a combination of the host material included in the N-type first non-doped layer 411a and the N-type dopant material, whereby the electron is injected into the first emitting part 100 by the N-type first doped layer 411b. The N-type dopant material may be alkali metals such as Li, Na, K or Cs, or alkali earth metals such as Mg, Sr, Ba or Ra.

According to the embodiment of the present invention, the N-type first charge generating layer (N-CGL) 411 is formed by a combination of the N-type first non-doped layer 411a and N-type first doped layer 411b comprising the same host material. The N-type first non-doped layer 411a is firstly formed by an deposition of the host material, and then the N-type first doped layer 411b is formed by additionally supplying the N-type dopant to the same host material, whereby the N-type first charge generating layer (N-CGL) 411 is formed by a continuous process.

The host material comprising the N-type first charge generating layer (N-CGL) 411 may be formed of an organic material with an electron transporting capacity, and preferably, an organic material having an electron mobility larger than $1 \times 10^{-4}$ cm$^2$/V·s.

Preferably, the host material comprising the N-type first charge generating layer (N-CGL) 411 easily transports the electron to the first emitting part 100, and prevents the hole from being moved from the first emitting part 100 to the second emitting part 200. In order to realize the easy transport of electron and the prevention for movement of hole, it is preferable that the host material has a LUMO (Lowest Unoccupied Molecular Orbital) level between −3.1 eV and −2.7, and has a HOMO (Highest Occupied Molecular Orbital) level between −6.2 eV and −5.8 eV. Also, a triplet energy gap of the host material of the N-type first charge generating layer (N-CGL) 411 is larger than 2.5 eV, preferably.

The host material of the N-type first charge generating layer (N-CGL) 411 having the above properties may be formed of heteroaryl-based compound or pyridyl-based derivative, but not limited to these materials. For example, the host material of the N-type first charge generating layer (N-CGL) 411 may be bipyridyl or phenanthroline. Also, the heteroaryl-based compound may be formed of a compound including nitrogen expressed by the following Chemical Formula 8, but not necessarily limited to this compound.

[Chemical Formula 8]

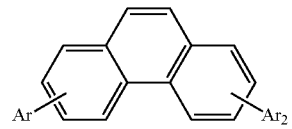

In the above Chemical Formula 8, 'Ar' is an aryl-based compound.

The P-type first charge generating layer (P-CGL) 412 comprises a P-type first doped layer 412a formed by a combination of a host material and a dopant material, and a P-type first non-doped layer 412b of the host material.

The P-type first doped layer 412a is provided on the N-type first charge generating layer (N-CGL) 411, particularly, directly on an upper surface of the N-type first charge generating layer (N-CGL) 411. The P-type first non-doped layer 412b is provided on the P-type first doped layer 412a, particularly, directly on an upper surface of the P-type first doped layer 412a. The P-type first non-doped layer 412b is in contact with the second emitting layer (EML) 250.

The P-type first non-doped layer 412b is formed of a host material which has a hole transporting capacity, whereby the hole is transported to the second emitting layer (EML) 250 of the second emitting part 200 by the P-type first non-doped layer 412b. In this respect, it is possible to remove the second hole transporting layer (HTL) 230 from the second emitting part 200. According as the second hole transporting layer (HTL) 230 is removed from the second emitting part 200, the P-type first non-doped layer 412b is formed directly on a lower surface of the second emitting layer (EML) 250.

The P-type first doped layer 412a is formed by including a P-type dopant material in the host material of the P-type first non-doped layer 412b, to thereby inject the hole into the second emitting part 200. The P-type dopant material may be an oxide of metal such as Mo or As, or an organic compound expressed by the following Chemical Formulas 9 to 11, but not necessarily limited to these materials.

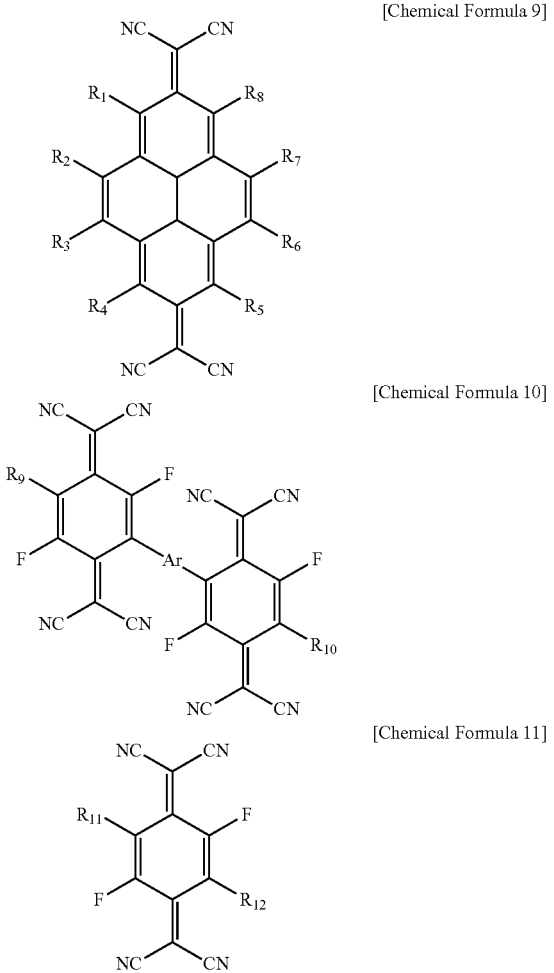

[Chemical Formula 9]

[Chemical Formula 10]

[Chemical Formula 11]

In the above Chemical Formulas 9 to 11, 'R1' to 'R12' may be selected from groups of hydrogen, deuterium, $CF_3$,

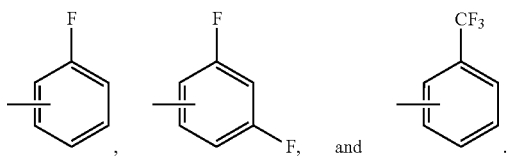

, , and .

According to the embodiment of the present invention, the P-type first charge generating layer (N-CGL) 412 is formed by a combination of the P-type first doped layer 412a and P-type first non-doped layer 412b comprising the same host material. Thus, the P-type first doped layer 412a is formed by the deposition of a host material and P-type dopant material, and then the P-type first non-doped layer 412b is formed by the deposition of the same host material without the P-type dopant material, whereby the P-type first charge generating layer (P-CGL) 412 is formed by a continuous process.

The host material of the P-type first charge generating layer (P-CGL) 412 may be formed of an organic material with a hole transporting capacity, and preferably, an organic material having a hole mobility same as or larger than $5×10^{-3}$ cm$^2$/V·s.

Preferably, the host material of the P-type first charge generating layer (P-CGL) 412 easily transports the hole to the second emitting part 200, and prevents the electron from being moved from the second emitting part 200 to the first emitting part 100. In order to realize the easy transport of hole and the prevention for movement of electron, it is preferable that the host material has a LUMO (Lowest Unoccupied Molecular Orbital) level between −2.6 eV and −2.0, and has a HOMO (Highest Occupied Molecular Orbital) level between −5.8 eV and −5.2 eV. Also, a triplet energy gap of the host material of the P-type first charge generating layer (P-CGL) 412 is larger than 2.8 eV, preferably.

The host material of the P-type first charge generating layer (P-CGL) 412 having the above properties may be formed of carbazole derivative or arylamine-based compound, but not limited to these materials. For example, the carbazole derivative may be formed of a compound expressed by the following Chemical Formula 12, but not necessarily limited to this compound.

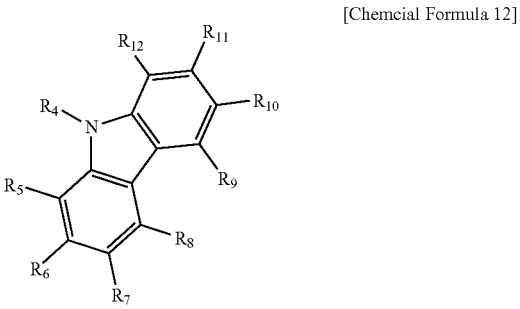

[Chemcial Formula 12]

In the above Chemical Formula 12, each of 'R4' to 'R12' may be selected from groups of hydrogen, deuterium, cyanine group, halogen group, substituted or un-substituted alkyl group of C1~C20, substituted or un-substituted alkoxyl group of C1~C20, substituted or un-substituted silyl group of C1~C20, substituted or un-substituted aryl group of C6~C30, substituted or un-substituted hetero aryl group of C6~C30, substituted or un-substituted cycloalkyl group of C3~C30, substituted or un-substituted aryloxy group of C6~C20, substituted or un-substituted aryl amino group of C12~C40, and substituted or un-substituted alkylamino group of C1~C20.

The second charge generating layer (CGL) 420 is provided between the second emitting part 200 and the third emitting part 300. The second charge generating layer (CGL) 420 comprises an N-type second charge generating layer (N-CGL) 421 being adjacent to the second emitting part 200, and a P-type second charge generating layer (P-CGL) 422 being adjacent to the third emitting part 300.

In the same manner as the aforementioned N-type first charge generating layer (N-CGL) 411, the N-type second charge generating layer (N-CGL) 421 may comprise an N-type second non-doped layer 421a of a host material with an electron transporting capacity, and an N-type second doped layer 421b formed by a combination of the same host material and a dopant material.

The N-type second non-doped layer 421a is the same as the aforementioned N-type first non-doped layer 411a, and the N-type second doped layer 421b is the same as the aforementioned N-type first doped layer 411b, whereby a repetitive explanation will be omitted.

In the same manner as the aforementioned P-type first charge generating layer (P-CGL) 412, the P-type second charge generating layer (P-CGL) 422 may comprise a P-type second doped layer 422a formed by a combination of a host material with an hole transporting capacity and a dopant material, and a P-type second non-doped layer 422b of the same host material.

The P-type second doped layer 422a is the same as the aforementioned P-type first doped layer 412a, and the P-type second non-doped layer 422b is the same as the aforementioned P-type first non-doped layer 412b, whereby a repetitive explanation will be omitted.

Figure 6:
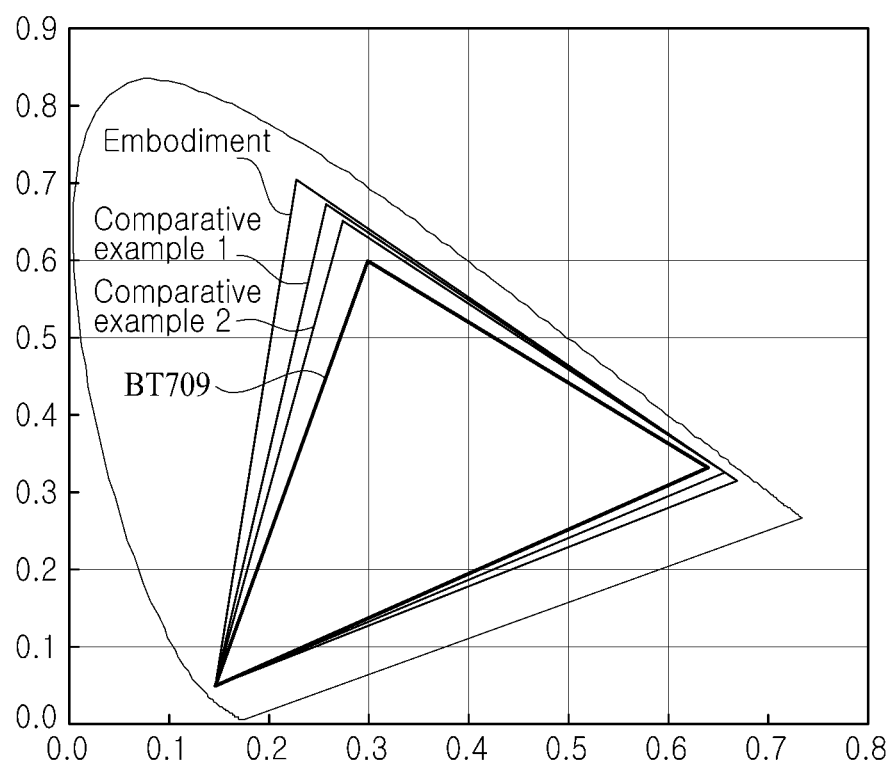
FIG. 6 illustrates BT709-based chromaticity coordinates of organic light emitting devices according to the embodiment and comparative examples.
Figure 7:
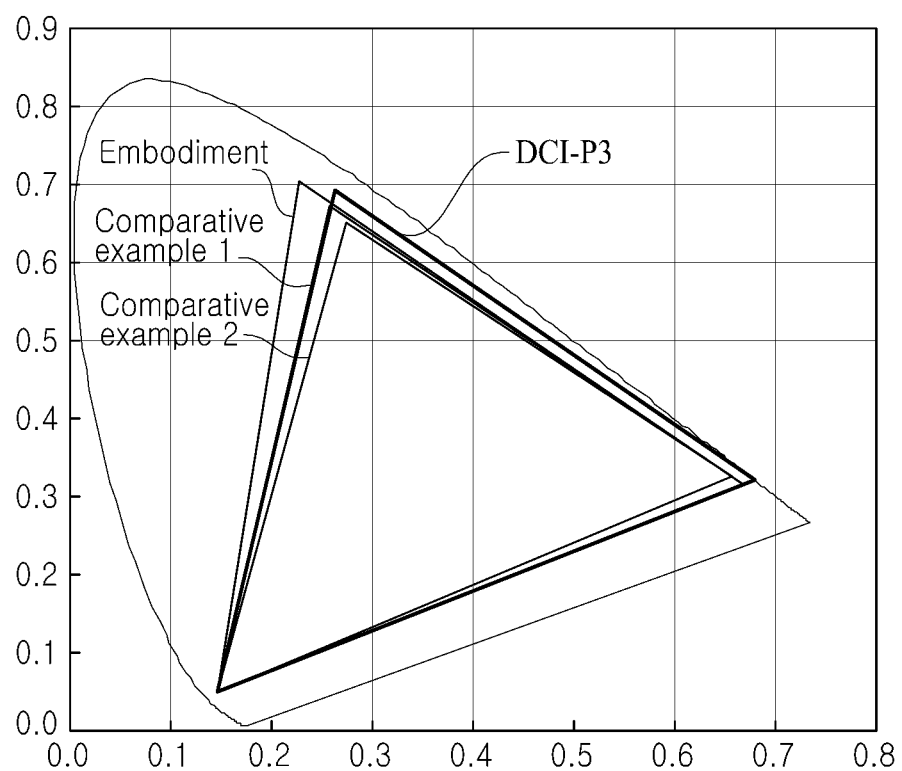
FIG. 7 illustrates DCI-P3 based chromaticity coordinates of organic light emitting devices according to the embodiment and comparative examples.

FIGS. 6 and 7 show chromaticity coordinates of the organic light emitting devices according to the embodiment and comparative examples, wherein FIG. 6 shows the chromaticity coordinates based on BT709, and FIG. 7 shows the chromaticity coordinates based on DCI-P3.

FIGS. 6 and 7 show the chromaticity coordinates for the embodiment of the present invention, comparative example 1 and comparative example 2 which include the first emitting layer 150 of the first emitting part 100, the second emitting layer 250 of the second emitting part 200 and the third emitting layer 350 of the third emitting part 300 as seen in Table 1 below.

TABLE 1

|  | Embodiment | Comparative example 1 | Comparative example 2 |
|---|---|---|---|
| First emitting layer 150 of first emitting part 100 | R-EML (153) B-EML (151) | R-EML (153) B-EML (151) | B-EML (151) |
| Second emitting layer 250 of second emitting part 200 | G-EML (257) YG-EML (255) | YG-EML (255) | YG-EML (255) |
| Third emitting layer 350 of third emitting part 300 | B-EML (351) R-EML (353) | B-EML (351) R-EML (353) | B-EML (351) R-EML (353) |

In more detail, the organic light emitting device according to the embodiment of the present invention includes the first emitting part 100 shown in FIG. 2A, the second emitting part 200 shown in FIG. 3A, and the third emitting part 300 shown in FIG. 4A. The organic light emitting device according to the comparative example 1 is obtained by providing the second emitting part 200 with a single emitting layer of yellow-green color emitting layer (YG-EML) 255 in the organic light emitting device according to the embodiment of the present invention. The organic light emitting device according to the comparative example 2 is obtained by providing the first emitting part 100 with a single emitting layer of blue-color emitting layer (B-EML) 151, and the second emitting part 200 with a single emitting layer of yellow-green color emitting layer (YG-EML) 255 in the organic light emitting device according to the embodiment of the present invention.

As shown in FIG. 6, the embodiment of the present invention shows 132.2% color reproduction range on the basis of BT709, the comparative example 1 shows 123.0% color reproduction range on the basis of BT709, and the comparative example 2 shows 120.1% color reproduction range on the basis of BT709.

As shown in FIG. 7, the embodiment of the present invention shows 105.2% color reproduction range on the basis of DCI-P3, the comparative example 1 shows 97.8% color reproduction range on the basis of DCI-P3, and the comparative example 2 shows 95.9% color reproduction range on the basis of DCI-P3.

As shown in FIGS. 6 and 7, in comparison to the comparative examples 1 and 2, the embodiment of the present invention which includes the first, second and third emitting layers 150, 250 and 350, wherein each emitting layer is formed of the two emitting layers, shows the relatively greater color reproduction range.

The organic light emitting device according to the present invention may be applied to a display device for displaying an image, and also applied to various emitting devices generally known to those in the art, for example, light devices.

The first emitting layer further comprises a red color or yellow-green color emitting layer, the blue color emitting layer in the first emitting layer is positioned closer to the first electrode than the red color or yellow-green color emitting layer in the first emitting layer.

The second emitting layer is a combination of at least two emitting layers among a red color emitting layer, a yellow-green color emitting layer and a green color emitting layer. One emitting layer of at least two emitting layers in the second emitting layer, which emits light with a relatively long wavelength, is positioned closer to the first electrode than another emitting layer of at least two emitting layers in the second emitting layer, which emits light with a relatively short wavelength.

The third emitting layer further comprises a red color or yellow-green color emitting layer. The blue color emitting layer in the third emitting layer is positioned closer to the second electrode than the red color or yellow-green color emitting layer in the third emitting layer.

A peak wavelength ($\lambda$max) of a blue dopant included in the blue color emitting layer in at least emitting parts is smaller than 456 nm, and a full width at half maximum (FWHM) of the blue dopant is between 30 nm and 40 nm.

A peak wavelength ($\lambda$max) of a red dopant included in the red color emitting layer in at least emitting parts is between 620 nm and 630 nm, and a full width at half maximum (FWHM) of the red dopant is between 50 nm and 60 nm.

A peak wavelength ($\lambda$max) of a yellow-green dopant included in the yellow-green color emitting layer in at least emitting parts is between 540 nm and 550 nm, and a full width at half maximum (FWHM) of the yellow-green dopant is between 70 nm and 100 nm.

A peak wavelength ($\lambda$max) of a green dopant included in the green color emitting layer in at least emitting parts is between 515 nm and 535 nm, and a full width at half maximum (FWHM) of the green dopant is between 70 nm and 80 nm.

A charge generating layer may be additionally formed between the first and second emitting parts, or between the second and third emitting parts, wherein the charge generating layer is a combination of N-type charge generating layer and P-type charge generating layer.

The N-type charge generating layer includes an N-type non-doped layer and an N-type doped layer on the N-type non-doped layer, and the N-type non-doped layer includes a host material with an electron transporting ability, and the N-type doped layer includes a combination of the host material having the same as the host material of the N-type non-doped layer and a dopant material.

The N-type non-doped layer is on an upper surface of the first or second emitting layer, and an electron transporting layer is not provided between the N-type non-doped layer and the first emitting layer or between the N-type non-doped layer and the second emitting layer.

The P-type charge generating layer includes a P-type doped layer on the N-type charge generating layer and a P-type non-doped layer on the P-type doped layer, and the P-type doped layer includes a combination of a host material with a hole transporting ability and a dopant material, and the P-type non-doped layer includes a host material having the same as the host material of the P-type doped layer.

The P-type non-doped layer is on a lower surface of the second or third emitting layer, and a hole transporting layer is not provided between the P-type non-doped layer and the second emitting layer or between the P-type non-doped layer and the third emitting layer.

The emitting parts to the closest to each electrode of said at least three emitting parts include said multiple level EML structure having a blue color emitting layer and a yellow-green color emitting layer or a red color emitting layer, wherein said blue color emitting layer is closer to said electrode than said yellow-green color emitting layer or said red color emitting layer.

The other emitting part of said at least three emitting parts includes at least two emitting layers among a green color emitting layer, a yellow-green color emitting layer and a red color emitting layer.

Said tandem type white OLED further comprises a charge generation layer between two emitting parts being in contact with the emitting layer included in one emitting part among the at least three emitting parts to minimize a total number of said additional layers of said tandem type white OLED.

According to the present invention, the blue (B) light with low efficiency is emitted from the two emitting parts, and more particularly, first and third emitting parts, whereby the emitting efficiency is improved in the organic light emitting device according to the present invention.

Also, each of the first emitting layer included in the first emitting part, the second emitting layer included in the second emitting part and the third emitting layer included in the third emitting part is formed of at least two emitting layers which emit lights with the different wavelengths, to thereby realize high color reproduction range and high color purity.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device, comprising:
   first and second electrodes;
   a first emitting part including a first emitting layer, the first emitting part provided between the first and second electrodes, and the first emitting layer having at least two emitting layers including a blue color emitting layer;
   a second emitting part including a second emitting layer, the second emitting part provided between the first emitting part and the second electrode, and the second emitting layer having at least two emitting layers including an emitting layer for emitting light having wavelength longer than that of the blue color emitting layer; and
   a third emitting part including a third emitting layer, the third emitting part provided between the second emitting part and the second electrode, and the third emitting layer having at least two emitting layers including a blue color emitting layer.

2. The organic light emitting device according to claim 1, wherein the first emitting layer further comprises a red color or yellow-green color emitting layer.

3. The organic light emitting device according to claim 2, wherein the blue color emitting layer in the first emitting layer is positioned closer to the first electrode than the red color or yellow-green color emitting layer in the first emitting layer.

4. The organic light emitting device according to claim 1, wherein the second emitting layer is a combination of at least two emitting layers among a red color emitting layer, a yellow-green color emitting layer and a green color emitting layer.

5. The organic light emitting device according to claim 4, wherein one emitting layer of at least two emitting layers in the second emitting layer, which emits light with a relatively long wavelength, is positioned closer to the first electrode than another emitting layer of at least two emitting layers in the second emitting layer, which emits light with a relatively short wavelength.

6. The organic light emitting device according to claim 1, wherein the third emitting layer further comprises a red color or yellow-green color emitting layer.

7. The organic light emitting device according to claim 6, wherein the blue color emitting layer in the third emitting layer is positioned closer to the second electrode than the red color or yellow-green color emitting layer in the third emitting layer.

8. The organic light emitting device according to claim 2, wherein a peak wavelength ($\lambda$max) of a blue dopant included in the blue color emitting layer in at least emitting parts is smaller than 456 nm, and a full width at half maximum (FWHM) of the blue dopant is between 30 nm and 40 nm.

9. The organic light emitting device according to claim 2, wherein a peak wavelength ($\lambda$max) of a red dopant included in the red color emitting layer in at least emitting parts is between 620 nm and 630 nm, and a full width at half maximum (FWHM) of the red dopant is between 50 nm and 60 nm.

10. The organic light emitting device according to claim 2, wherein a peak wavelength ($\lambda$max) of a yellow-green dopant included in the yellow-green color emitting layer in at least emitting parts is between 540 nm and 550 nm, and a full width at half maximum (FWHM) of the yellow-green dopant is between 70 nm and 100 nm.

11. The organic light emitting device according to claim 4, wherein a peak wavelength ($\lambda$max) of a green dopant included in the green color emitting layer in at least emitting parts is between 515 nm and 535 nm, and a full width at half maximum (FWHM) of the green dopant is between 70 nm and 80 nm.

12. The organic light emitting device according to claim 1, further comprising a charge generating layer between the first emitting part and the second emitting part or between the second emitting layer and the third emitting part,
   wherein the charge generating layer is a combination of N-type charge generating layer and P-type charge generating layer.

13. The organic light emitting device according to claim 12, wherein the N-type charge generating layer includes an N-type non-doped layer and an N-type doped layer on the N-type non-doped layer, and the N-type non-doped layer includes a host material with an electron transporting ability, and the N-type doped layer includes a combination of the host material having the same as the host material of the N-type non-doped layer and a dopant material.

14. The organic light emitting device according to claim 13, wherein the N-type non-doped layer is on an upper surface of the first or second emitting layer, and an electron transporting layer is not provided between the N-type non-doped layer and the first emitting layer or between the N-type non-doped layer and the second emitting layer.

15. The organic light emitting device according to claim 12, wherein the P-type charge generating layer includes a P-type doped layer on the N-type charge generating layer and a P-type non-doped layer on the P-type doped layer, and the P-type doped layer includes a combination of a host material with a hole transporting ability and a dopant material, and the P-type non-doped layer includes a host material having the same as the host material of the P-type doped layer.

16. The organic light emitting device according to claim 15, wherein the P-type non-doped layer is on a lower surface of the second or third emitting layer, and a hole transporting layer is not provided between the P-type non-doped layer and the second emitting layer or between the P-type non-doped layer and the third emitting layer.

17. A display device, comprising:
 a tandem type white organic light emitting diode (OLED) having at least three emitting parts between two electrodes;
 a multiple level emitting layer (EML) structure having at least two emitting layers and additional layers, implemented in each of said at least three emitting parts of said tandem type white OLED; and
 wherein said each of emitting layers is configured on a particular location such that the display device emits white color having a three peak wavelength, based on optimal optical cavity characteristics considering an entire thickness of said tandem type white OLED.

18. The display device according to claim 17, wherein the emitting parts to the closest to each electrode of said at least three emitting parts include said multiple level EML structure having a blue color emitting layer and a yellow-green color emitting layer or a red color emitting layer, wherein said blue color emitting layer is closer to said electrode than said yellow-green color emitting layer or said red color emitting layer.

19. The display device according to claim 18, wherein the other emitting part of said at least three emitting parts includes at least two emitting layers among a green color emitting layer, a yellow-green color emitting layer and a red color emitting layer.

20. The display device according to claim 17, wherein said tandem type white OLED further comprises a charge generation layer between two emitting parts being in contact with the emitting layer included in one emitting part among the at least three emitting parts to minimize a total number of said additional layers of said tandem type white OLED.

* * * * *